United States Patent
Takiar et al.

(10) Patent No.: US 6,448,632 B1
(45) Date of Patent: Sep. 10, 2002

(54) METAL COATED MARKINGS ON INTEGRATED CIRCUIT DEVICES

(75) Inventors: Hem P. Takiar, Fremont; Nikhil Vishwanath Kelkar, Santa Clara; Ken Pham, San Jose, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/649,264

(22) Filed: Aug. 28, 2000

(51) Int. Cl.[7] ............................................. H01L 23/552
(52) U.S. Cl. ........................................ 257/659; 257/678
(58) Field of Search ................................. 257/659, 660, 257/678, 687, 778, 618–629, 797, 94, 777, 728, 730

(56) References Cited

U.S. PATENT DOCUMENTS

| | | | | |
|---|---|---|---|---|
| 5,166,772 A | * | 11/1992 | Soldner et al. | |
| 5,317,195 A | * | 5/1994 | Ishikawa et al. | |
| 5,557,142 A | * | 9/1996 | Gilmore et al. | |
| 6,086,979 A | * | 7/2000 | Kanbara et al. | |
| 6,261,919 B1 | * | 7/2001 | Omizo | |

* cited by examiner

Primary Examiner—Nathan J. Flynn
Assistant Examiner—Kevin Quinto
(74) Attorney, Agent, or Firm—Beyer Weaver & Thomas LLP

(57) ABSTRACT

A semiconductor device comprising a mark located on a surface of the semiconductor device and a metal layer covering the marked surface and the mark. The metal layer functions to protect the semiconductor device from exposure to electromagnetic radiation and allows the mark to be visible for identification purposes. The present invention also pertains a method of manufacturing the semiconductor device as described. The method involves forming a mark on a semiconductor substrate surface of the device and covering the semiconductor substrate surface and the mark with a layer of metal so that the device is protected from exposure to electromagnetic radiation and allows the mark to be visible for identification purposes.

13 Claims, 4 Drawing Sheets

METAL COATED MARKINGS ON INTEGRATED CIRCUIT DEVICES

FIELD OF THE INVENTION

The present invention relates generally to semiconductor devices, and more specifically, to semiconductor devices that are protected from exposure to electromagnetic radiation.

BACKGROUND

The number and types of electronic systems in which semiconductor integrated circuits are being used continues to increase. New applications for integrated circuits often present new design and operating requirements. Most notably, the demand for the miniaturization of electronic systems forces the production of smaller and thinner integrated circuits (IC's) that occupy a smaller "footprint" on printed circuit boards. One way to reduce the footprint is to discard the package used to encapsulate the IC. Unpackaged IC's contain bare silicon dies that have electrical contacts formed directly on a surface of the dies.

Unpackaged devices are preferably utilized in environments that are not exposed to certain energy levels of electromagnetic (EM) radiation. For instance, it is desirable to shield unpackaged devices from EM radiation having wavelengths greater than 700 nm ($700 \times 10^{-9}$ m) because such radiation penetrates silicon. Such penetrating EM radiation adds energy into an IC, thereby possibly causing unwanted electron flow in the circuitry. This is referred to as "drift" current. It is generally desired to protect unpackaged IC's from infrared (IR) radiation, which has a wavelengths of approximately 700 nm–1 mm in length. It is usually sufficient to protect the devices from infrared radiation by placing the devices within enclosures which block out visible light. New electronic components, however, require unpackaged IC's to operate in conditions which expose the IC's to infrared radiation. For example, cellular phones, pagers, and personal digital assistants (PDA's) contain infrared radiation sources such as sunlight, LEDs, or backlights. Unpackaged IC's must be shielded from these IR sources in order to operate correctly in these environments.

Currently, a layer of epoxy is applied to unpackaged IC to block the transmission of IR radiation. A mark used for manufacturing purposes is then placed upon the layer of epoxy. The marking, (e.g., symbols, letters, etc.) is important because it allows the IC to be identified or it allows the IC's orientation to be determined during a manufacturing process. Unfortunately, applying epoxy to the surface of unpackaged devices has certain disadvantages. First, the process of applying a layer of epoxy onto a semiconductor device requires a substantial amount of handling. This handling, in turn, increases the likelihood of damaging the IC devices. Secondly, the size of the infrastructure for applying the epoxy is difficult to scale. This makes it less practicable to adjust manufacturing processes according to production volume requirements. Finally, the relatively slow curing process for epoxy materials reduces the throughput rate of a manufacturing process.

In view of the foregoing, a method for protecting unpackaged IC's from electromagnetic radiation and which allows a manufacturing mark to be identified upon a surface of the IC's would be desirable.

SUMMARY

The present invention is directed towards protecting unpackaged IC's from electromagnetic radiation and allowing a manufacturing mark to be identified upon a surface of the IC's. The invention pertains to a semiconductor device that has a mark located on a surface of the device, and a metal layer covering the marked surface and the mark. The metal layer functions to protect the semiconductor device from exposure to electromagnetic radiation and allows the mark to be visible for manufacturing purposes. The present invention also pertains to a method of manufacturing the semiconductor device as described. The method involves forming a mark on a semiconductor substrate surface of the device and covering the semiconductor substrate surface and the mark with a layer of metal. The metal layer, according to one embodiment, is applied in a manner such that the device is protected from electromagnetic radiation and yet, at the same time, the mark remains visible for identification purposes. These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Generally, the present invention involves protecting semiconductor devices from exposure to electromagnetic radiation by applying a protective layer of material to the surface of the devices. However, the protective layer of the present invention must also allow a marking, formed on a surface of the device, to remain visible during semiconductor manufacturing processes. For example, if the mark is formed of trenches that are engraved into the surface of a device, then a substantially uniform thickness protective layer of material covers and conforms to the surface of the trenches. This results in a protective layer which has a contour defined by the mark, thereby allowing the mark to be represented and identified on the surface of the protective layer.

Figure 1A:
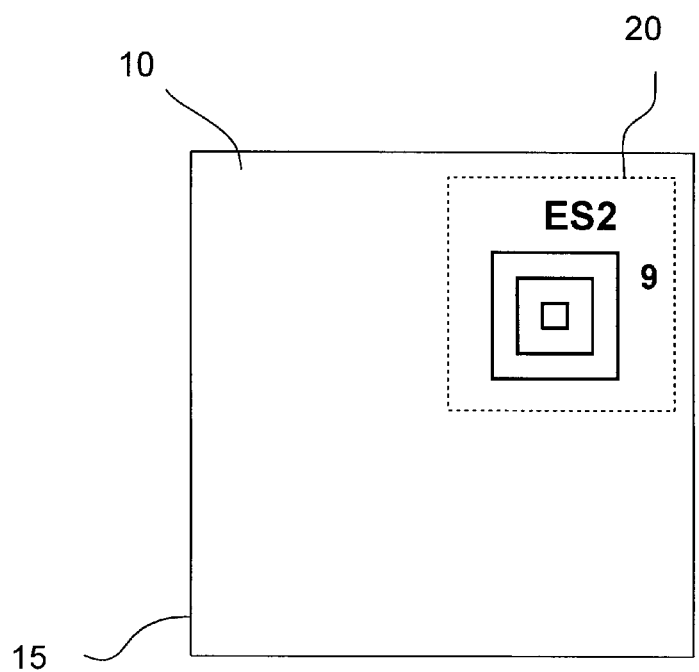
FIG. 1A illustrates a top plan view of a semiconductor device, which has a mark on its backside.
Figure 1B:
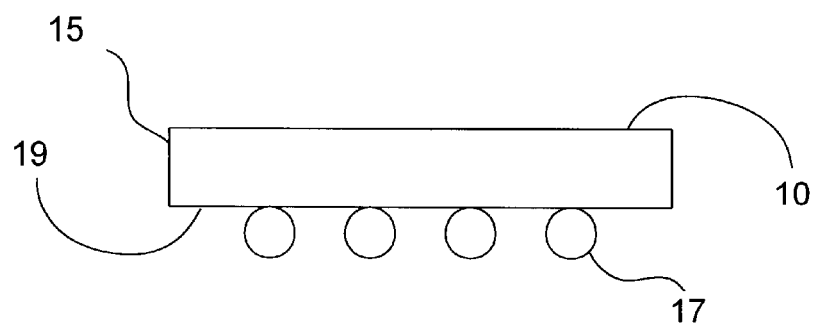
FIG. 1B illustrates a side plan view of the semiconductor device in FIG. 1A.
Figure 1C:
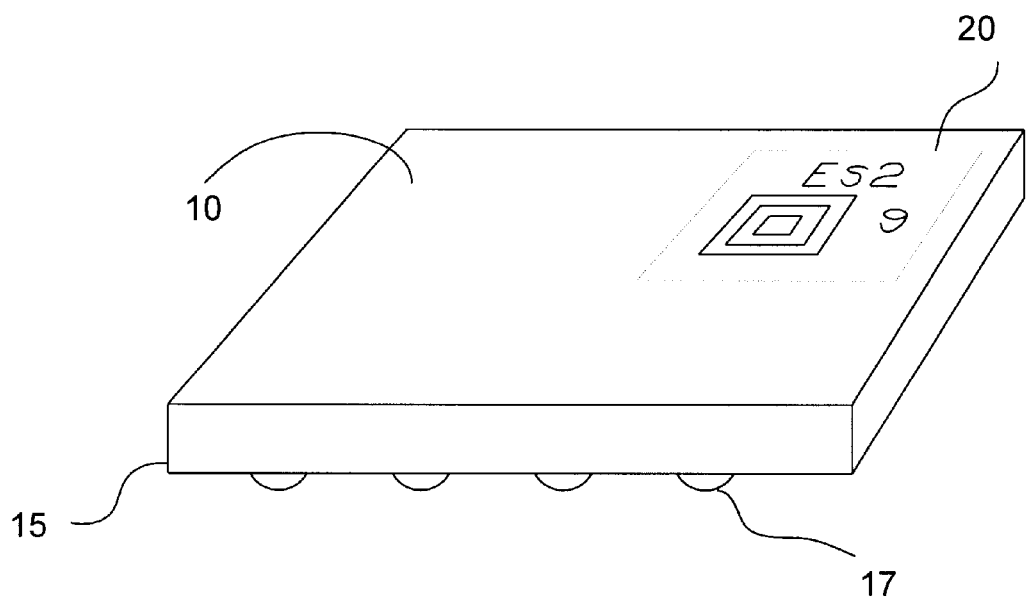
FIG. 1C illustrates a perspective view of the semiconductor device in FIG. 1A.

FIG. 1A illustrates a top plan view of one embodiment of a semiconductor device 15 which has an identifying mark 20 on its backside 10. FIG. 1B illustrates a side plan view of the semiconductor device 15. As can be seen in FIG. 1B, electrical contacts 17 are formed on the front side 19 of the device 15. FIG. 1C illustrates a perspective view of the semiconductor device 15. The device in FIGS. 1A–1C is a flip-chip type semiconductor device. As illustrated, flip-chips generally have electrical contacts formed on a surface of the device and are not packaged within a packaging material such as plastic. Both of these characteristics allow flip-chips to occupy less space when attached to printed circuit boards. However, because these devices are not packaged within a packaging material, the bare silicon devices may not operate properly when exposed to certain light sources. For example, the infrared light portion of the electromagnetic spectrum is capable of transmitting through silicon and impinging upon the integrated circuits within. Infrared light exposure upon the embedded circuits within the silicon material adds energy and therefore causes "drift" current within the device. As can be appreciated, flip-chips may take on many different forms (e.g., Ball-grid arrays, micro Surface Mount Devices, etc.). Also, the number and type of electrical contacts 17, and the size of the device 15 may vary.

The mark 20 may be used for a variety of purposes. For example, the mark may identify the type of semiconductor device upon which the mark is formed. The mark also can be placed in a certain location, in a specific corner for example, so that the orientation of the device may be determined. One reason why the orientation of the device is important is so that the device may be properly positioned and connected to a printed circuit board.

According to one embodiment, the mark 20 is formed by creating recessed regions on the backside 10 of the device 15 in a pattern that forms the desired mark. FIG. 1A and 1C illustrate a mark 20 formed of multiple recessed regions. One formation of recessed regions represents the letter "E," another represents "S," another "2," and yet another represents a "9." Three other recessed regions form box outline formations that are contained within each other. Together, these recessed regions form a mark that facilitates the handling of the semiconductor device during a manufacturing process. It should be noted that in alternative embodiments, the mark may contain recessed regions of any variety of geometries. These recessed regions may be thin or wide, channels or trenches, straight or curved. The recessed regions are visible because contrast is created when a light source is directed at the recessed regions at an oblique angle. In other words, the height difference between the backside 10 of the device and recessed regions of the mark 20 creates shadows. The contrast, or shadows, can then be detected by a camera in order to identify the mark 20.

Figure 2A:
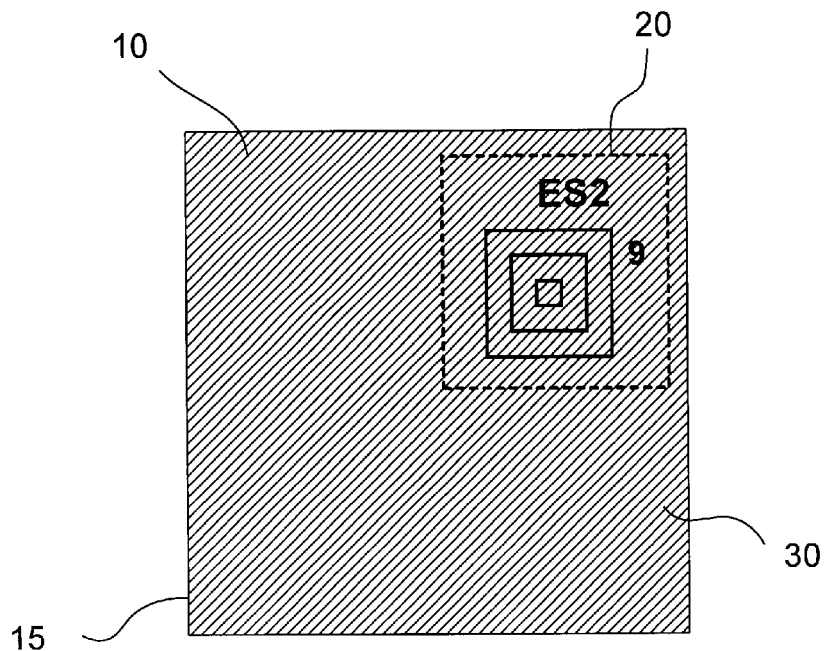
FIG. 2A illustrates a top plan view of a marked semiconductor device, which has a metal layer formed over the identifying mark according to one embodiment of the present invention.
Figure 2B:
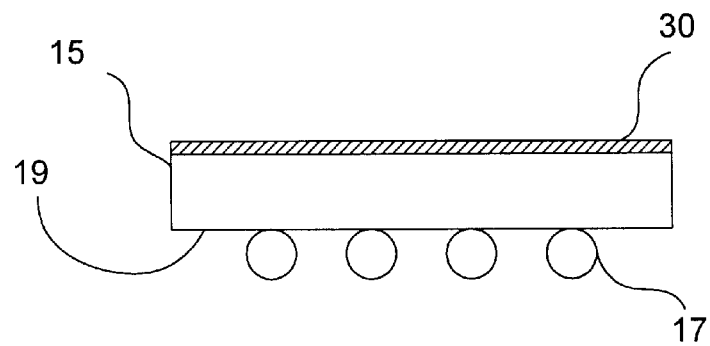
FIG. 2B illustrates a side plan view of the semiconductor device of FIG. 2A.
Figure 2C:
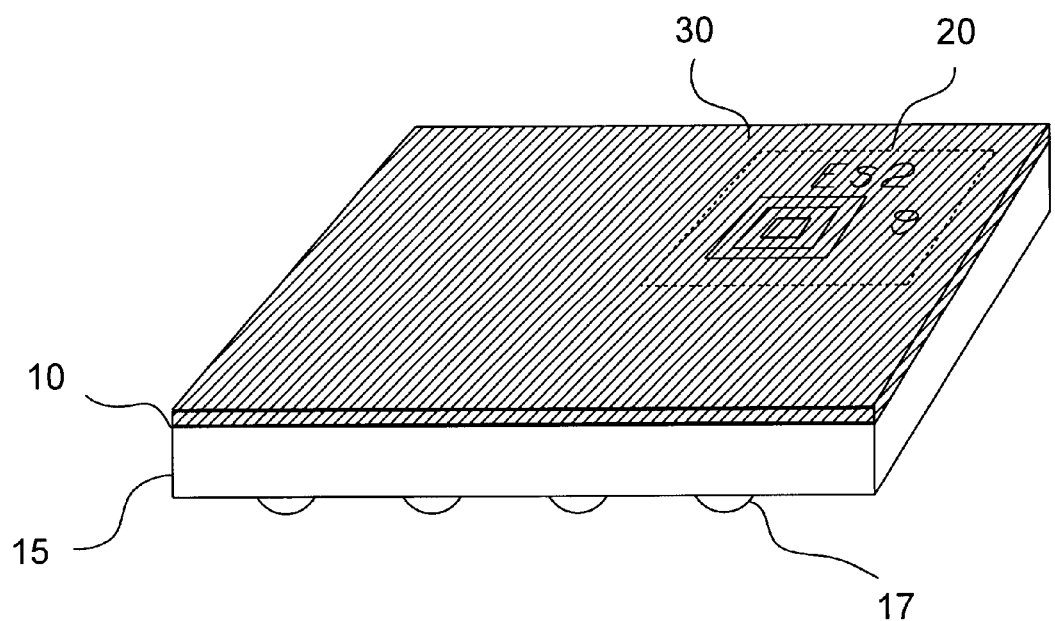
FIG. 2C illustrates a perspective view of the semiconductor device of FIG. 2A.

FIG. 2A illustrates a top plan view of the semiconductor device 15 from FIGS. 1A–1C wherein a metal layer 30 is formed over its backside 10 so that the metal layer 30 covers the mark 20. FIG. 2B illustrates a side plan view of the semiconductor device of FIG. 2A. FIG. 2C illustrates a perspective view of the semiconductor device of FIG. 2A. The metal layer 30 is applied so that it conforms to the backside 10 and to the surface of the mark 20. FIGS. 2B and 2C show the thickness of the metal layer 30 that is applied to the backside 10 of the semiconductor device 15. In the case of the embodiment shown, the metal layer conforms to the depressed regions of the mark 20. By conforming to the contours of the backside 10 and the depressed regions of the mark 20, the exposed surface of the metal layer 30 contains depressed regions defined by, and therefore similar to that of, the actual mark 20. The metal layer 30 is sufficiently thick to prevent infrared radiation from reaching the silicon material of the device 15. At the same time, the metal layer 30 is not excessively thick whereas the depressed regions on the metal layer 30 would be overfilled with metal, thereby causing the mark to be unidentifiable. Overfilled depressed regions would cause the mark 30 to be unidentifiable because the depth of the depressed areas on the metal layer 30 with respect to the surface of the metal layer 30 would not be sufficiently deep to create contrast capable of being detected. In other words, the metal layer 30 would fill in the recessed regions of the mark 20 such that the surface of the metal layer 30 would be relatively flat. Therefore, the metal layer 30 should have a thickness in a range wherein the metal layer is sufficiently thick to prevent transmission of infrared radiation, yet is sufficiently thin so that the mark may be identified on the surface of the metal layer 30. In some typical embodiments, the thickness of the metal layer is in the range of 1000–5000 Angstroms. Of course, as the demand for miniaturization of devices continues into the future, the thickness of the metal layer may be even thinner.

In one embodiment of the invention, the thickness of the metal layer 30 prevents the transmission of infrared light waves. Infrared light has wavelengths of approximately 700–1 mm. However, the metal layer 30 must also be capable of preventing the transmission of electromagnetic radiation having wavelengths approximately greater to or equal to 900 nm, since energies having these wavelengths are also capable of passing through silicon. It should be appreciated that transmission of energy having various energy levels can be blocked by using metal layers 30 formed of various metal types and by varying the metal layer 30 thickness. The metal of the metal layer 30 can be titanium, chromium, aluminum, or any other material capable of preventing the transmission of infrared energy. It should also be appreciated that various protective metal layers may also be applied to semiconductor devices that are formed from materials other than silicon. For instance, the present invention may be applied to semiconductor devices formed of gallium arsenide.

In some embodiments, the metal layer 30 covers only certain portions of the backside 10 of the device 15. Only certain portions of the device in these embodiments are covered because only those certain portions of the device 15 contain integrated circuits and therefore need protection. It is also noted that devices other than the flip-chip type may be protected by the metal layer of the present invention. Any type of marked device having an exposed silicon (or metal) surface can be covered by a metal layer as described in the present invention so that drift current may be prevented.

In an alternative embodiment of the invention, the mark is formed by applying material to the backside of the semiconductor device according to a pattern, which represents the desired mark. The material formation of this mark has a height that rises above the backside of the device so that contrast may be created. For example, the mark may be formed of deposits of solder material. A metal layer covers and conforms to the surfaces of the material that forms the mark, and to the backside of the device. By way of example, the formation of material may be three deposits of metal, each forming the letters "E," "S," and "2" as in FIG. 1A.

Another aspect of the present invention pertains to a method for protecting a semiconductor device from electromagnetic radiation while preserving the function of a mark formed on a surface of the device. This method begins by forming a mark on a surface of the semiconductor device. Generally, the mark is formed on a surface of the device which is opposite to that upon which electrical contacts are formed. The surface of the semiconductor device opposite to the electrical contacts, referred to as the "backside" of the device, is usually silicon. The mark must create a contour upon the surface of the device so that contrast is created when viewed with a light source. For instance, the mark may be formed by creating recessed regions upon the surface of the device. In other words, the mark may be engraved into the semiconductor device surface. The engraving may be performed using mechanical engraving devices or by a laser emitting device. An alternative method of forming the mark deposits a material onto the surface of the device. Both the engraved mark and the deposited mark are formed according to a design which represents the desired mark. These marks create contrast (shadows) when a light source impinges upon the mark.

After the device is marked, the surface of the device that is likely to be exposed to harmful electromagnetic radiation is covered with a layer of protective metal. For flip-chips, this surface is the semiconductor substrate surface, which is opposite of the electrical contacts. The metal layer is applied so that its thickness is sufficient to block the transmission of harmful electromagnetic radiation, yet, at the same time, allows the underlying mark to be identified. The metal layer is applied so that the metal layer has a substantially uniform thickness across the surface of the semiconductor and on the surface of the mark. The uniform thickness of the metal layer allows the metal layer to obtain a contour which conforms to the contour of the semiconductor surface and the mark. In certain implementations of the method, the metal layer thickness ranges from 1000–5000 Angstroms.

The metal layer may be applied by using the well-known process of sputtering. Sputtering coats a surface with a metal by depositing the metal at an atomic level. The use of sputtering machines is advantageous because a relatively limited amount handling of the semiconductor device is required during the sputtering process. This minimizes the likelihood of damaging the semiconductor devices during the manufacturing process. Semiconductor devices having thickness' of greater than approximately 0.2 mm may be safely handled during sputtering processes. The sputtering process also is advantageous because minimal time is required for the metal layer to cure and because sputtering machines are easily scalable to process varying quantities of semiconductor devices. Another process for applying the metal coating include vapor deposition methods.

In an alternative embodiment of the method, a thin layer of the exposed surface of the semiconductor substrate surface is removed before the mark is formed. The exposed surface of the substrate surface tends to be oxidized due to the exposure to air. By removing this oxidized layer, the mark may be formed and the metal layer may be applied on an un-oxidized substrate surface. The resulting mark has greater contrast for better visibility. Removing a layer of the substrate also results in a thinner device which may be more easily placed within an electronic device. Some metal coated devices having substrates which were ground have thickness' of 0.7 mm. The removal operation may be performed by either a grinding or polishing device.

In yet another embodiment of the invention, the mark is identified by an optical device. For instance, a video camera may be used to identify the mark on the device as the device passes through a manufacturing process. The method of the present invention may be implemented upon individual semiconductor devices or upon semiconductor devices which are still part of an array of devices formed within a semiconductor wafer.

While this invention has been described in terms of several preferred embodiments, there are alteration, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A radiation-protected semiconductor device comprising:

a semiconductor device having a first surface and a second surface;

a mark located on the second surface, the mark configured to facilitate the identification of the device; and a metal layer formed over the second surface of the device and over the mark, the metal layer configured to protect the semiconductor device from exposure to electromagnetic radiation and to allow the mark to be visible for identification purposes.

2. The device as recited in claim 1 wherein the mark is further configured to facilitate orientating of the device.

3. The device as recited in claim 1 wherein the metal layer has a thickness in the range of 1000–5000 angstroms.

4. The device as recited in claim 1 wherein the metal layer has a thickness which is capable of blocking the transmission of electromagnetic radiation having wavelengths approximately in range of 700 mm–1 mm.

5. The device as recited in claim 1 wherein the metal layer has a thickness which is capable of blocking the transmission of electromagnetic radiation having wavelengths approximately greater than or equal to 900 nm.

6. The device as recited in claim 1 wherein the mark is at least one depressed region form ed on the second surface of the device.

7. The device as recited in claim 6 wherein the metal layer is further configured to conform to the at least one depressed region of the mark formed on the second surface of the device.

8. The device as recited in claim 1 wherein the metal layer is composed of a metal selected from the group consisting of titanium, aluminum, and chromium.

9. The device as recited in claim 1 wherein the device is part of an array of devices formed on a semiconductor wafer.

10. The device as recited in claim 1 wherein the mark includes at least one formation of material formed on the second surface of the device, the at least one formation of material rising above the second surface of the device, the second surface and the at least one formation of material defining a device contour.

11. The device as recited in claim 10 wherein the metal layer conforms to the device contour such that the metal layer has a metal layer contour that has approximately the same shape as the device contour.

12. The device as recited in claim 1 wherein the semiconductor device is a flip-chip type device.

13. A radiation-protected semiconductor device comprising:

a semiconductor device having a first surface and a second surface;

a mark located on the second surface, the mark formed of a pattern that is either depressed into or raised above the second surface; and a metal layer formed over the second surface of the device and over the mark such that the metal layer conforms to the contour of the mark, the metal layer configured to protect the semiconductor device from exposure to electromagnetic radiation and to allow the mark to be visible for identification purposes.

* * * * *